US010416260B2

(12) United States Patent
Fuderer et al.

(10) Patent No.: US 10,416,260 B2
(45) Date of Patent: Sep. 17, 2019

(54) MAGNETIC FIELD PROBE FOR MRI WITH A FLUOROELASTOMER OR A SOLUTION OF A FLUORINE-CONTAINING COMPOUND

(71) Applicant: KONINKLIJKE PHILIPS N.V., Eindhoven (NL)

(72) Inventors: Miha Fuderer, Eindhoven (NL); Jeroen Alphons Pikkemaat, Waalre (NL)

(73) Assignee: KONINKLIJKE PHILIPS N.V., Eindhoven (NL)

( * ) Notice: Subject to any disclaimer, the term of this patent is extended or adjusted under 35 U.S.C. 154(b) by 1521 days.

(21) Appl. No.: 14/351,753

(22) PCT Filed: Oct. 12, 2012

(86) PCT No.: PCT/IB2012/055548
§ 371 (c)(1),
(2) Date: Apr. 14, 2014

(87) PCT Pub. No.: WO2013/057643
PCT Pub. Date: Apr. 25, 2013

(65) Prior Publication Data
US 2014/0266201 A1 Sep. 18, 2014

Related U.S. Application Data

(60) Provisional application No. 61/547,949, filed on Oct. 17, 2011.

(30) Foreign Application Priority Data

Oct. 17, 2011 (EP) ..................................... 11185403

(51) Int. Cl.
*G01R 33/56* (2006.01)
*G01R 33/24* (2006.01)
(Continued)

(52) U.S. Cl.
CPC ......... *G01R 33/5601* (2013.01); *G01R 33/24* (2013.01); *G01R 33/443* (2013.01);
(Continued)

(58) Field of Classification Search
CPC ............. G01R 33/24; G01R 33/34046; G01R 33/443; G01R 33/5601; G01R 33/56563; G01R 33/58
(Continued)

(56) References Cited

U.S. PATENT DOCUMENTS 4,639,364 A * 1/1987 Hoey ..................... A61K 49/06
424/9.37
4,719,423 A * 1/1988 Vinegar ................. G01R 33/56
324/303
(Continued)

FOREIGN PATENT DOCUMENTS

EP 1582886 A1 10/2005
EP 1847845 A1 10/2007
(Continued)

OTHER PUBLICATIONS

Buz'ko, V. Yu, et al. "Solvation microdynamics of the Gd (3+) ion in 4-methyl-N-butylpyridinium tetrafluoroborate as probed by 19 F NNR and EPR." Russian journal of inorganic chemistry 55.8 (2010): 1257-1259.*
(Continued)

*Primary Examiner* — Rishi R Patel

(57) ABSTRACT

A magnetic field within a magnetic resonance (MR) imaging system (300) is measured. The MR system includes a magnet (304) with an imaging zone (308), a radio-frequency transceiver (316), and a magnetic field probe (322) located within the imaging zone. The magnetic field probe includes a fluorine sample (404) including any one of the following: a fluoroelastomer (700), a fluorine containing ionic liquid
(Continued)

(600), and a solution of a fluorine containing compound. The field probe further includes an antenna (406) for manipulating the magnetic spins of the fluorine sample and for receiving fluorine magnetic resonance data from the fluorine sample. The antenna is connected to the radio-frequency transceiver. The method includes acquiring (100, 200) the fluorine magnetic resonance data using the magnetic resonance imaging system and calculating (102, 206) a magnetic field strength (344) using the fluorine magnetic resonance data.

19 Claims, 5 Drawing Sheets

(51) Int. Cl.
  *G01R 33/44* (2006.01)
  *G01R 33/565* (2006.01)
  *G01R 33/58* (2006.01)
  *G01R 33/34* (2006.01)
(52) U.S. Cl.
  CPC ....... *G01R 33/56563* (2013.01); *G01R 33/58* (2013.01); *G01R 33/34046* (2013.01)
(58) Field of Classification Search
  USPC .......................... 324/300–322; 600/407–424
  See application file for complete search history.

(56) References Cited

U.S. PATENT DOCUMENTS

| | | | | |
|---|---|---|---|---|
| 5,098,529 | A * | 3/1992 | Feldhues | H01B 1/127 205/419 |
| 5,327,084 | A * | 7/1994 | Theurel | G01R 33/24 324/301 |
| 7,619,414 | B2 | 11/2009 | Yamamoto | |
| 9,097,752 | B2 * | 8/2015 | Suijver | G01R 33/30 |
| 2005/0218892 | A1 | 10/2005 | Pruessmann et al. | |
| 2007/0219443 | A1 | 9/2007 | Ehnholm et al. | |
| 2009/0295389 | A1 | 12/2009 | Pruessmann | |
| 2010/0301856 | A1 * | 12/2010 | Hyde | A61K 49/1866 324/309 |

FOREIGN PATENT DOCUMENTS

| | | | | |
|---|---|---|---|---|
| GB | | 1083266 A * | 9/1967 | ............. G01R 23/10 |
| JP | | 2006105637 A | 4/2006 | |
| WO | | 2010029804 A1 | 3/2010 | |
| WO | WO 2011076228 A1 * | | 6/2011 | ........... G01R 33/281 |

OTHER PUBLICATIONS

Noack, Manfred, and Gilbert Gordon. "Oxygen-17 NMR and Copper EPR Linewidths in Aqueous Solutions of Copper (II) Ion and 2, 2'-Dipyridine." The Journal of Chemical Physics 48.6 (1968): 2689-2699.*
Ando, Shinji, et al. "Analysis of cross-polarisation dynamics between $^1$H and $^{19}$F in Viton fluoroelastomer using solid-state $^{19}$F magic angle spinning and $^1$H->$^{19}$F cross polarization magic angle spinning NMR." Magnetic resonance in chemistry 37.10 (1999): 709-720.*
Brunner, D.O. et al "Autocalibration of Field Monitoring Arrays by Reference Tones", International Society for Magnetic Resonance in Medicine. Apr. 2011, p. 1841.
Pavan, M. et al "Frequency-Division Multiplexing for Concurrent Imaging and Field Monitoring", ISMRM-ESMRMB Joint Annual Meeting 2010, vol. 3.
Barmet, Christoph et al "Concurrent Higher-Order Field Monitoring for Routine Head MRI: An Integrated Heteronuclear Setup", ISMRM-ESMRMB Joint Annual Meeting 2010, vol. 3.
Zanche De N. et al "Advances in NMR Probe Technology for Magnetic Field Monitoring" International Society for Magnetic Resonance in Medicine. May 2006, p. 781.
Yu, V. et al "Solvation Microdynamics of the Gd(3+) Ion in 4-Methyl-N-Butylpyridinium Tetrafluoroborate as Probed by 19F NMR and EPR", Physical Methods of Investigation, Russian Journal of Inorganic Chemistry, vol. 55, No. 8, 2010, pp. 1257-1258.

* cited by examiner

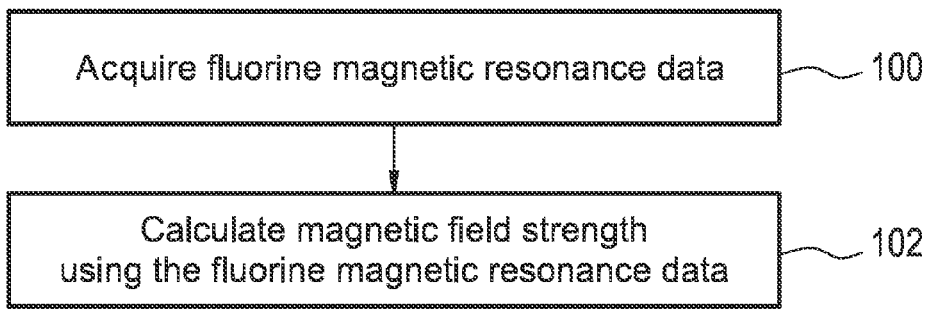
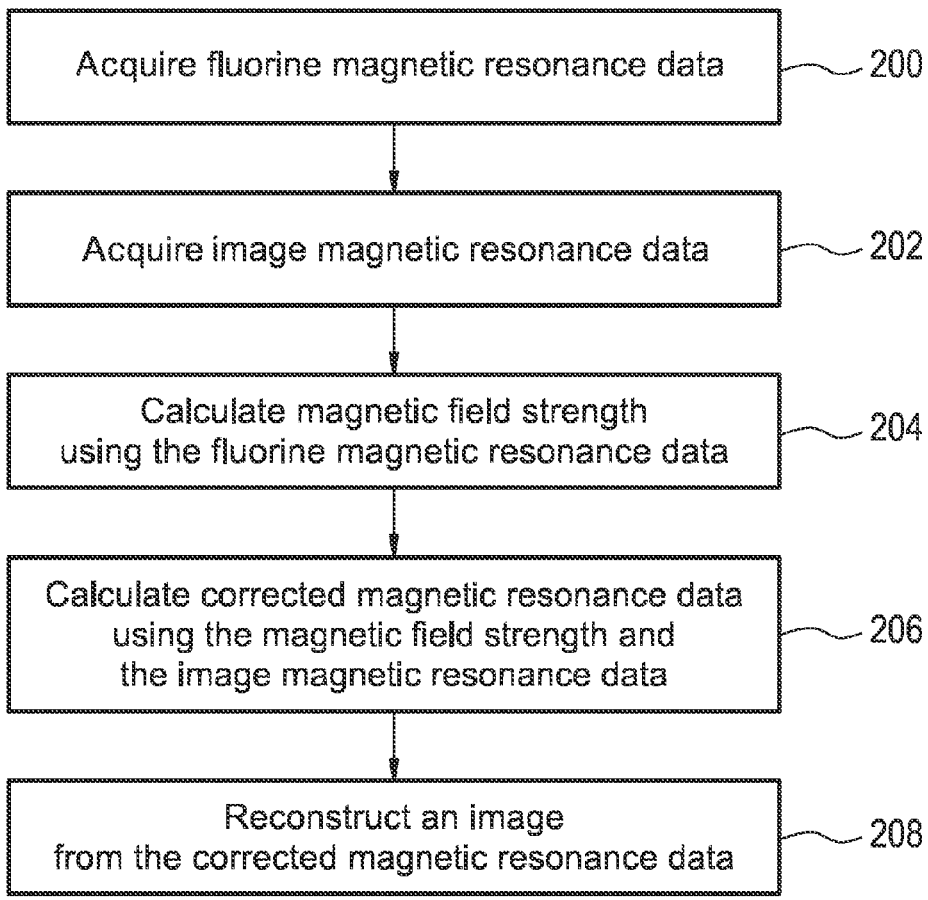

MAGNETIC FIELD PROBE FOR MRI WITH A FLUOROELASTOMER OR A SOLUTION OF A FLUORINE-CONTAINING COMPOUND

CROSS-REFERENCE TO PRIOR APPLICATIONS

This application is the U.S. National Phase application under 35 U.S.C. § 371 of International Application No. PCT/IB2012/055548, filed on Oct. 12, 2012, which claims the benefit of U.S. Provisional Patent Application No. 61/547,949, filed on Oct. 17, 2011 and European Patent Application No. 11185403.0, filed on Oct. 17, 2011. These applications are hereby incorporated by reference herein.

TECHNICAL FIELD

The invention relates to the quantitative measurement of magnetic field strengths in magnetic resonance imaging systems, in particular without limitation to the use of Fluorine for making the magnetic field measurements.

BACKGROUND OF THE INVENTION

During magnetic resonance imaging the magnetic field may vary during the acquisition of the magnetic resonance image. For instance the switching of the magnetic field gradients may introduce unwanted magnetic field variations. The placement of foreign objects or even the presence of tissue may affect the static magnetic field also. Magnetic measurements may be used for correcting for unwanted magnetic field variations.

A magnetic field probe is a probe or sensor which enables the measurement of spatio-temporal variations in a magnetic field. A magnetic field probe may be constructed by taking a material which has a known Nuclear Magnetic Resonance (NMR) signal. The frequency of specific NMR resonances is a function of the magnetic field. In NMR spectrometers, the magnetic field strength is known and in this way a spectrum may be used to identify the sample. For a magnetic field probe the reverse is true. A known material is placed into a magnetic field of an unknown strength, the spectra or the location of a particular resonance or resonances may then be used to determine the magnetic field strength.

European patent application EP 1 582 886 A1 describes a method of magnetic resonance imaging spectroscopy where additional data is acquired from at least one monitoring field probe positioned in the vicinity of and surrounding an object being imaged, during the execution of the magnetic resonance sequence.

United States patent application US 20090195389 A1 discloses the use of perfluorinated hydrocarbons to construct a field probe.

SUMMARY OF THE INVENTION

It is advantageous to make magnetic field probes with Fluorine 19 (19F) as the active nucleus. In the prior art perfluorinated hydrocarbons such as hexafluorobenzene ($C_6F_6$) are used. These substances are either difficult to encapsulate and/or difficult to handle if in liquid form, or they have an exceedingly short T2 relaxation time in solid form. The situation of a short T2 relaxation time in combination with a long T1 relaxation time adversely affects the signal-to-noise ratio of the 19F magnetic resonance measurement and, as a consequence, the field measurement becomes less accurate and/or more time consuming. Ideally the T1/T2 ratio is in the range of 1-10. Embodiments of the invention may provide for alternative 19F sources with improved functionality. One alternative to perfluorinated hydrocarbons is the use of perfluorinated polysiloxanes. These elastic solids have improved T1/T2 ratios compared to more commonly known fluorinated solids, like fluorocarbon polymers (Teflon). Another alternative is the use of a solution of fluoride or other fluorine-containing ions. This solution may also contain paramagnetic ions for optimal 19F-MR T1 and T2 values. The T1 of aqueous fluoride ions can be significantly reduced by adding GdDTPA to the solution. The final alternative is the use of fluorine-containing ionic liquids, optionally containing paramagnetic ions for optimal 19F-MR T1 and T2 values. The T1 of the room-temperature ionic liquid 4-methyl-N-butylpyridinium tetrafluoroborate can be significantly reduced by adding anhydrous gadolinium(III)trifluoromethanesulfonate $Gd(CF_3SO_3)_3$ to the ionic liquid.

A field probe or magnetic field probe as used herein encompasses a device intended to dynamically measure the actual magnetic field during a Magnetic Resonace (MR) measurement sequence. Having a multitude of such devices within the bore of an MR device, allows to characterize the precise field pattern caused by the switching of the field-gradients, plus any other wanted and unwanted causes of magnetic field variations. Knowing these field patterns may enable the reconstruction of MR images (or spectra) with fewer artifacts.

Research results have shown that it is advantageous to choose another active nucleus for the field-probe than the one used for the MR-measurement itself. Since H is usually used for MR imaging, 19F is attractive for the active-nucleus of the probe.

Prior art field probes have used perfluorocarbons that have a lot of symmetry. A typical example thereof is hexafluorobenzene, $C_6F_6$.

The disadvantage of perfluorocarbons is that these are difficult to handle and very difficult to seal and/or to contain within any type of packaging. These materials, being "the slipperiest substances in the world," tend to escape from containers and to simply evaporate, which gives probes a "best before" date—they usually last less than half a year. Solid perfluorinated hydrocarbons (e.g. $(C_2F_4)_n$, or PTFE) are rather solid and have exceedingly short T2 values.

Embodiments of the invention may use a solution of fluoride ions, a solution of fluorine-containing ions, a fluorine-containing ionic liquid, or a piece of polymeric (per) fluorinated siloxanes ("fluorosilicone elastomer") to provide the 19F. The solution of fluoride ions, the solution of fluorine-containing ions, and the ionic liquid may optionally contain paramagnetic ions for optimal 19F-MR T1 and T2 relaxation times. Such embodiments of the invention may provide for a field probe which is easier to handle and therefore easier and more cost effective to manufacture. Embodiments of the invention may also provide for a field probe where the 19F stays within its container, has a high density of 19F nuclei, has a T2 value of at least 100 μs and a T1/T2 ratio of preferably not more than 10.

A 'computer-readable storage medium' as used herein encompasses any tangible storage medium which may store instructions which are executable by a processor of a computing device. The computer-readable storage medium may be referred to as a computer-readable non-transitory storage medium. The computer-readable storage medium may also be referred to as a tangible computer readable medium. In some embodiments, a computer-readable storage medium may also be able to store data which is able to be accessed by the processor of the computing device. Examples of computer-readable storage media include, but are not limited to: a floppy disk, a magnetic hard disk drive, a solid state hard disk, flash memory, a USB thumb drive, Random Access Memory (RAM), Read Only Memory (ROM), an optical disk, a magneto-optical disk, and the register file of the processor. Examples of optical disks include Compact Disks (CD) and Digital Versatile Disks (DVD), for example CD-ROM, CD-RW, CD-R, DVD-ROM, DVD-RW, or DVD-R disks. The term computer readable-storage medium also refers to various types of recording media capable of being accessed by the computer device via a network or communication link. For example a data may be retrieved over a modem, over the internet, or over a local area network.

'Computer memory' or 'memory' is an example of a computer-readable storage medium. Computer memory is any memory which is directly accessible to a processor. Examples of computer memory include, but are not limited to: RAM memory, registers, and register files.

'Computer storage' or 'storage' is an example of a computer-readable storage medium. Computer storage is any non-volatile computer-readable storage medium. Examples of computer storage include, but are not limited to: a hard disk drive, a USB thumb drive, a floppy drive, a smart card, a DVD, a CD-ROM, and a solid state hard drive. In some embodiments computer storage may also be computer memory or vice versa.

A 'computing device' as used herein encompasses to any device comprising a processor. A 'processor' as used herein encompasses an electronic component which is able to execute a program or machine executable instruction. References to the computing device comprising "a processor" should be interpreted as possibly containing more than one processor or processing core. The processor may for instance be a multi-core processor. A processor may also refer to a collection of processors within a single computer system or distributed amongst multiple computer systems. The term computing device should also be interpreted to possibly refer to a collection or network of computing devices each comprising a processor or processors. Many programs have their instructions performed by multiple processors that may be within the same computing device or which may even be distributed across multiple computing devices.

A 'user interface' as used herein is an interface which allows a user or operator to interact with a computer or computer system. A 'user interface' may also be referred to as a 'human interface device.' A user interface may provide information or data to the operator and/or receive information or data from the operator. A user interface may enable input from an operator to be received by the computer and may provide output to the user from the computer. In other words, the user interface may allow an operator to control or manipulate a computer and the interface may allow the computer indicate the effects of the operator's control or manipulation. The display of data or information on a display or a graphical user interface is an example of providing information to an operator. The receiving of data through a keyboard, mouse, trackball, touchpad, pointing stick, graphics tablet, joystick, gamepad, webcam, headset, gear sticks, steering wheel, pedals, wired glove, dance pad, remote control, and accelerometer are all examples of user interface components which enable the receiving of information or data from an operator.

A 'hardware interface' as used herein encompasses a interface which enables the processor of a computer system to interact with and/or control an external computing device and/or apparatus. A hardware interface may allow a processor to send control signals or instructions to an external computing device and/or apparatus. A hardware interface may also enable a processor to exchange data with an external computing device and/or apparatus. Examples of a hardware interface include, but are not limited to: a universal serial bus, IEEE 1394 port, parallel port, IEEE 1284 port, serial port, RS-232 port, IEEE-488 port, Bluetooth connection, Wireless local area network connection, TCP/IP connection, Ethernet connection, control voltage interface, MIDI interface, analog input interface, and digital input interface.

Magnetic Resonance (MR) data is defined herein as being the recorded measurements of radio frequency signals emitted by atomic spins by the antenna of a Magnetic resonance apparatus during a magnetic resonance imaging scan. A Magnetic Resonance Imaging (MRI) image is defined herein as being the reconstructed two or three dimensional visualization of anatomic data contained within the magnetic resonance imaging data. This visualization can be performed using a computer.

In one aspect the invention provides for a method of measuring a magnetic field within a magnetic resonance imaging system. The magnetic resonance imaging system comprises a magnet with an imaging zone. The magnetic resonance imaging system further comprises a radio-frequency transceiver. The magnetic resonance imaging system further comprises at least one magnetic field probe. A magnetic field probe as used herein encompasses a device configured for dynamically measuring the magnetic field during the acquisition of magnetic resonance data. The field probe is located within the imaging zone. The magnetic field probe comprises a fluorine sample. The fluorine within the fluorine sample may comprise $^{19}$F, which may also be referred to as 19F or Fluorine 19.

Fluorine is typically used for field probes because the radio-frequency emissions generated by the fluorine molecules do not interfere with signals created by hydrogen spins. The fluorine sample comprises any one of the following: a fluoroelastomer, a fluorine-containing ionic liquid, and a solution of fluorine-containing compound. Essentially the field probe can be constructed from any one of the previously mentioned three types of samples. The field probe further comprises an antenna for manipulating the magnetic spins of the fluorine sample and for receiving fluorine magnetic resonance data from the fluorine sample. The antenna is connected to the radio-frequency transceiver. The method comprises the step of acquiring the fluorine magnetic resonance data using the magnetic resonance imaging system. The method further comprises the step of calculating a magnetic field strength using the fluorine magnetic resonance data. This embodiment may be advantageous because the field probe may be used to measure changes in the magnetic field as magnetic resonance data is acquired. For instance the magnetic resonance imaging system may have gradient coils which cause the magnetic field within the imaging zone to change. Acquiring accurate magnetic field data during the acquisition of the magnetic resonance data enables the correction of the magnetic resonance data due to field homogeneities such that a more accurate magnetic resonance image may be constructed.

In another embodiment there are multiple field probes located within the imaging zone. The fluorine magnetic resonance data is acquired from multiple field probes. A spatially dependent magnetic field is calculated using the fluorine magnetic resonance data from the multiple field probes.

In another embodiment the fluorine sample comprises the fluorine-containing ionic liquid. This embodiment may be advantageous because there is a large concentration of fluorine atoms within the ionic liquid. The fluorine 19 magnetic resonance signal is therefore inherently high.

In addition, ionic liquids are not slippery, do not evaporate, and are very stable towards oxidation and reduction. Some ionic liquids are sensitive to hydrolysis, however it may be beneficial to store such ionic liquids under completely anhydrous conditions.

In another embodiment the fluorine-containing ionic liquid comprises an anion.

In another embodiment the anion is bis(trifluoromethylsulfonyl)imide.

In another embodiment the anion is tetrafluoroborate.

In another embodiment the anion is hexafluorophosphate.

In another embodiment the anion is tetrafluoroaluminate.

In another embodiment the anion is hexafluoroantimonate.

In another embodiment the anion is hexafluoroarsenate.

In another embodiment the anion is bis(trifluoromethane)sulfonamide.

In another embodiment the anion is tris(trifluoromethylsulfonyl)methide.

In another embodiment the anion is triflate.

In another embodiment the anion and/or cation contains a paramagnetic species, for example an ion of the first-row transition-metal series (such as $Ti^{3+}$, $V^{4+}$, $Cu^{2+}$, $V^{3+}$, $Ni^{2+}$, $V^{2+}$, $Cr^{3+}$, $Co^{2+}$, $Mn^{4+}$, $Cr^{2+}$, $Fe^{2+}$, $Mn^{2+}$, $Fe^{3+}$), or a trivalent ion of the lanthanide series ($Ce^{3+}$, $Pr^{3+}$, $Nd^{3+}$, $Sm^{3+}$, $Eu^{3+}$, $Gd^{3+}$, $Tb^{3+}$, $Dy^{3+}$, $Ho^{3+}$, $Er^{3+}$, $Tm^{3+}$, $Yb^{3+}$).

In another embodiment the fluorine-containing ionic liquid further comprises a fluorine relaxation agent. A relaxation agent as used herein is an agent which is used to reduce the T1 and/or T2 relaxation times. A fluorine relaxing agent as used herein is a relaxing agent for fluorine-containing compounds or substances. The addition of a fluorine relaxation agent to the fluorine-containing ionic liquid may be beneficial because the T1 relaxation time may be greatly decreased. The reduction of the T1 relaxation time is beneficial as it enables you to excite the NMR signal from the fluorine containing sample more frequently and more completely.

In another embodiment the fluorine containing ionic liquid is 1-Ethyl-3-methylimidazolium bis(trifluoromethylsulfonyl)imide, In another embodiment the fluorine containing ionic liquid 1-Butyl-4-methylpyridinium tetrafluoroborate.

In another embodiment the fluorine relaxation agent is manganese(II)trifluoromethanesulfonate or gadolinium(III)trifluoromethanesulfonate.

In another embodiment the fluorine sample comprises the fluoroelastomer. Using fluoroelastomer may be beneficial because the fluoroelastomer may be solid which is beneficial because the fluorine sample is not in liquid state and not contained in a container or vessel which may leak.

In another embodiment the fluoroelastomer is a siloxane.

In another embodiment the fluoroelastomer is a fluorinated polysiloxane In another embodiment the fluoroelastomer is FVMQ.

In another embodiment the fluoroelastomer a fluorine-containing polymer.

In another embodiment the fluoroelastomer is methyl vinyl silicone.

In another embodiment the fluoroelastomer is a vinylidenefluoride elastomer.

In another embodiment the fluoroelastomer is a tetrafluoroethylene elastomer. In another embodiment the fluoroelastomer is a perfluoromethylvinylether-based elastomer.

In another embodiment the fluoroelastomer is a chlorotrifluoroethylene-based elastomer.

In another embodiment the fluoroelastomer is a pentafluoropropylene-based elastomer.

In another embodiment the fluoroelastomer is a hexafluoropropylene-based elastomer.

In another embodiment the fluoroelastomer is a fluoroinorganic polymer.

In another embodiment the fluoroelastomer is fluorosilicone.

In another embodiment the fluoroelastomer is fluorophosphazene.

In another embodiment the fluorine sample comprises a solution of a fluorine-containing compound. As used herein a fluorine-containing compound encompasses a solution of a fluorine-containing salt, acid, or base. The use of a solution of a fluorine-containing compound may have several advantages, for instance such solutions are typically stable and non-volatile which means they can be easily stored and used for a long period of time. The pH of such solutions can significantly influence the solubility and the stability (e.g. towards hydrolysis). The fluorine T1 and T2 values may also be adjusted to optimal values by adding soluble paramagnetic compounds to the solution.

In another embodiment the fluorine containing compound is Trifluoroacetic acid.

In another embodiment the fluorine containing compound is a Trifluoroacetate salt.

In another embodiment the fluorine containing compound is Hydrofluoric acid.

In another embodiment the fluorine containing compound is a Flouride salt.

In another embodiment the fluorine containing compound is Hexafluorosilicic acid.

In another embodiment the fluorine containing compound is a hexafluorosilicic salt.

In another embodiment the fluorine containing compound is Hexafluorophosphoric acid.

In another embodiment the fluorine containing compound is a Hexafluorophosphate salt.

In another embodiment the fluorine containing compound is Fluoroboric acid.

In another embodiment the fluorine containing compound is a Fluoroborate salt.

In another embodiment the fluorine containing compound is a tetrafluoroborate salt.

In another embodiment the fluorine containing compound is Sodiumtetrafluoroborate.

In another embodiment the fluorine containing compound is copper(II)tetrafluoroborate.

In another embodiment the fluorine containing compound is a Trifluoromethanesulfonate salt.

In another embodiment the solution of a fluorine-containing compound further comprises a fluorine relaxation agent. This may be beneficial because the T1 and/or T2 times may be adjusted.

In another embodiment the fluorine-containing compound is sodium tetrafluoroborate and the fluorine relaxation agent is Copper(II) nitrate trihydrate. Copper(II) nitrate may be useful as a relaxation agent since it is well soluble in water and the copper(II) fluoride, which may form in small quantities as a result of hydrolysis of the fluorine-containing anion, is highly soluble as well.

In another embodiment the cation contains a paramagnetic species, for example an ion of the first-row transition-metal series (such as $Ti^{3+}$, $V^{4+}$, $Cu^{2+}$, $V^{3+}$, $Ni^{2+}$, $V^{2+}$, $Cr^{3+}$, $Co^{2+}$, $Mn^{4+}$, $Cr^{2+}$, $Fe^{2+}$, $Mn^{2+}$, $Fe^{3+}$), or a trivalent ion of the lanthanide series ($Ce^{3+}$, $Pr^{3+}$, $Nd^{3+}$, $Sm^{3+}$, $Eu^{3+}$, $Gd^{3+}$, $Tb^{3+}$, $Dy^{3+}$, $Ho^{3+}$, $Er^{3+}$, $Tm^{3+}$, $Yb^{3+}$). In another embodiment the cation is copper(II). Copper(II) is a good candidate for the cation since copper(II) fluoride, which may form in small quantities as a result of hydrolysis of the fluorine-containing anion, is highly soluble in water.

In another embodiment the cation is manganese(II).

In another embodiment the cation is a trivalent ion of the lanthanide series.

In another embodiment the method further comprises the step of acquiring image magnetic resonance data from a subject using the magnetic resonance imaging system. Image magnetic resonance data as used herein encompasses magnetic resonance data which is able to be reconstructed into a magnetic resonance image. In some cases the image magnetic resonance data and the fluorine magnetic resonance data may be acquired at the same time. For instance the fluorine magnetic resonance data may contain magnetic resonance data from a frequency spectrum associated with fluorine and the image magnetic resonance data may be acquired from the frequency spectrum associated with the NMR frequency of hydrogen atoms. The method further comprises the step of calculating corrected magnetic resonance data using the magnetic field strength and the image magnetic resonance data. In some instances there may be more than one field probe and in this case a spatially dependent magnetic field strength may be used for correcting the image magnetic resonance data. The method further comprises the step of reconstructing an image from the corrected magnetic resonance data. An advantage of this embodiment may be that disturbances in the magnetic field for instance due to the field gradient coils may be compensated for accurately resulting in more accurate magnetic resonance images.

In another aspect the invention provides for a magnetic field probe for a magnetic resonance imaging system comprising a fluorine sample. The sample comprises any one of the following: a fluoroelastomer, a fluorine-containing ionic liquid, and a solution of a fluorine-containing compound. The magnetic field probe further comprises an antenna for manipulating the magnetic spins of the fluorine sample and for receiving fluorine magnetic resonance data from the fluorine sample.

In another aspect the invention provides for a magnetic resonance imaging system comprising a magnet with an imaging zone. The magnetic resonance imaging system further comprises a radio-frequency transceiver. The magnetic resonance imaging system further comprises a magnetic field according to an embodiment of the invention. The field probe is connected to the radio-frequency transceiver. The field probe is located within the imaging zone. Advantages of such a magnetic resonance imaging system have been previously discussed.

In another embodiment the magnetic resonance imaging system comprises multiple field probes each of which are connected to the radio-frequency transceiver. The multiple field probes in some embodiments may be used for characterizing the dynamic and/or static magnetic field pattern of the magnetic resonance imaging system.

BRIEF DESCRIPTION OF THE DRAWINGS

In the following preferred embodiments of the invention will be described, by way of example only, and with reference to the drawings in which:

FIG. 1 shows a flow chart which illustrates a method according to an embodiment of the invention;

FIG. 2 shows a flow chart which illustrates a method according to a further embodiment of the invention;

DETAILED DESCRIPTION OF THE EMBODIMENTS

Like numbered elements in these figures are either equivalent elements or perform the same function. Elements which have been discussed previously will not necessarily be discussed in later figures if the function is equivalent.

FIG. 1 shows a flow chart which illustrates a method according to an embodiment of the invention. In step 100 fluorine magnetic resonance data is acquired. Next in step 102 a magnetic field strength is calculated using the fluorine magnetic resonance data. In some embodiments the fluorine magnetic resonance data is acquired from multiple field probes. In this case the magnetic field strength at multiple spatial positions may be calculated. In addition the fluorine magnetic resonance data may be acquired at multiple time periods or continuously through the acquisition of image magnetic resonance data. As such the magnetic field strength may be spatially dependent and/or temporally dependent. That is to say a multi-dimensional magnetic field map which changes as a function of time may also be calculated using the method shown in FIG. 1.

FIG. 2 shows a flow diagram which illustrates a method according to a further embodiment of the invention. In step 200 fluorine magnetic resonance data is acquired. In step 202 image magnetic resonance data is acquired. Steps 200 and 202 may be performed in any order and may also be performed simultaneously. Next in step 204 a magnetic field strength is calculated using the fluorine magnetic resonance data. In some embodiments the magnetic field strength may be calculated before the image magnetic resonance data is acquired. Next in step 206 corrected magnetic resonance data is calculated using the magnetic field strength and the image magnetic resonance data. Finally in step 208 an image is reconstructed from the corrected magnetic resonance data. Again, the fluorine magnetic resonance data may be acquired from multiple field probes and also at multiple time periods or intervals. As such the corrected magnetic resonance data may be corrected for changes in the magnetic field both in time and in position.

Figure 3:
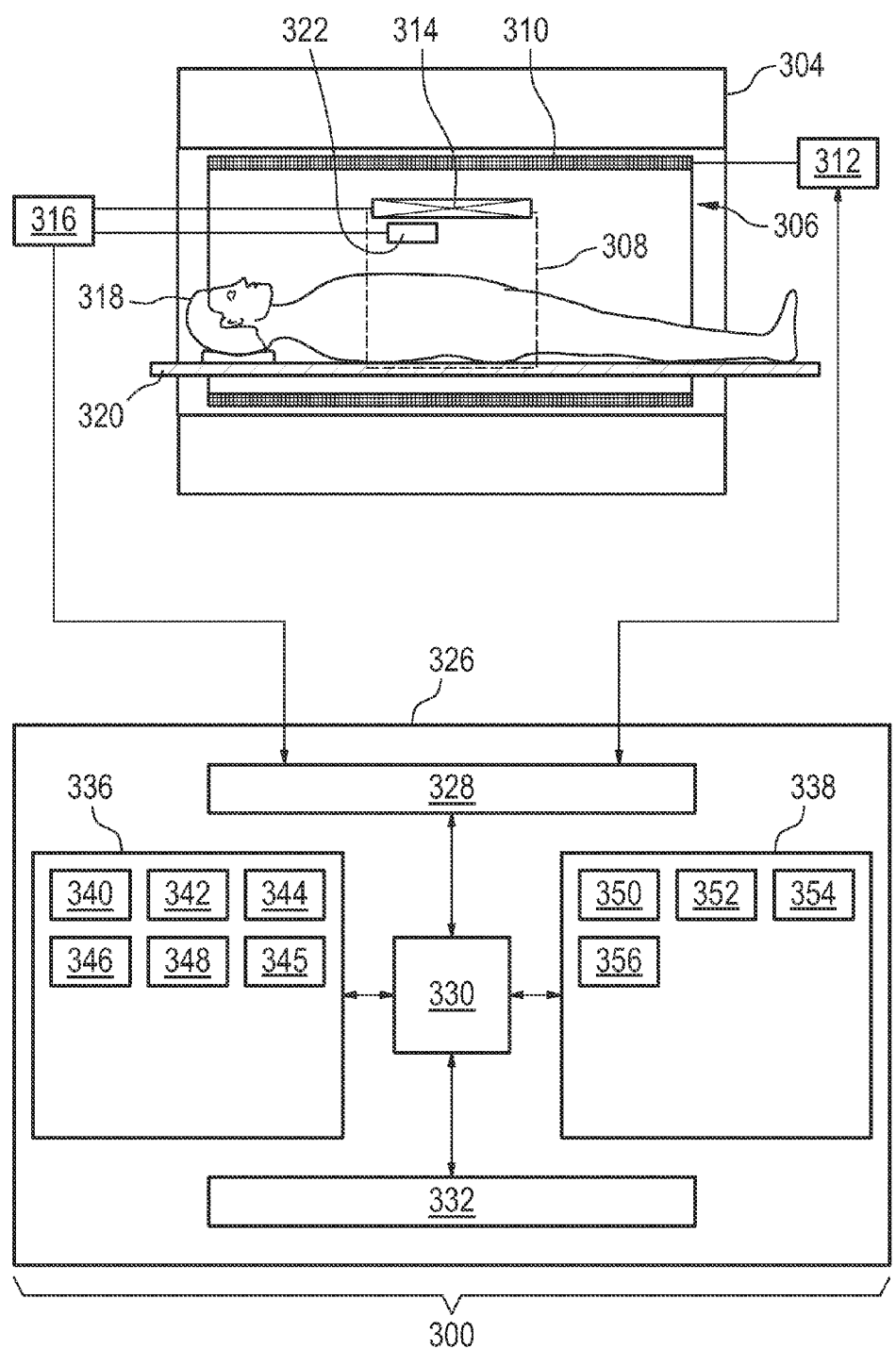
FIG. 3 illustrates a magnetic resonance imaging system according to an embodiment of the invention.

FIG. 3 illustrates an example of a magnetic resonance imaging system 300 according to an embodiment of the invention. The magnetic resonance imaging system 300 comprises a magnet 304. The magnet 304 is a superconducting cylindrical type magnet 304 with a bore 306 through it. The magnet 304 has a liquid helium cooled cryostat with superconducting coils. It is also possible to use permanent or resistive magnets. The use of different types of magnets is also possible for instance it is also possible to use both a split cylindrical magnet and a so called open magnet. A split cylindrical magnet is similar to a standard cylindrical magnet, except that the cryostat has been split into two sections to allow access to the iso-plane of the magnet, such magnets may for instance be used in conjunction with charged particle beam therapy. An open magnet has two magnet sections, one above the other with a space in-between that is large enough to receive a subject: the arrangement of the two sections area similar to that of a Helmholtz coil. Open magnets are popular, because the subject is less confined. Inside the cryostat of the cylindrical magnet there is a collection of superconducting coils. Within the bore 306 of the cylindrical magnet 304 there is an imaging zone 308 where the magnetic field is strong and uniform enough to perform magnetic resonance imaging.

Within the bore 306 of the magnet there is also a set of magnetic field gradient coils 310 which is used for acquisition of magnetic resonance data to spatially encode magnetic spins within the imaging zone 308 of the magnet 304. The magnetic field gradient coils 310 connected to a magnetic field gradient coil power supply 312. The magnetic field gradient coils 310 are intended to be representative. Typically magnetic field gradient coils 310 contain three separate sets of coils for spatially encoding in three orthogonal spatial directions. A magnetic field gradient power supply supplies current to the magnetic field gradient coils. The current supplied to the magnetic field gradient coils 310 is controlled as a function of time and may be ramped or pulsed.

Adjacent to the imaging zone 308 is a radio-frequency coil 314 for manipulating the orientations of magnetic spins within the imaging zone 308 and for receiving radio transmissions from spins also within the imaging zone 308. The radio frequency antenna may contain multiple coil elements. The radio frequency antenna may also be referred to as a channel or antenna. The radio-frequency coil 314 is connected to a radio frequency transceiver 316. The radio-frequency coil 314 and radio frequency transceiver 316 may be replaced by separate transmit and receive coils and a separate transmitter and receiver. It is understood that the radio-frequency coil 314 and the radio frequency transceiver 316 are representative. The radio-frequency coil 314 is intended to also represent a dedicated transmit antenna and a dedicated receive antenna. Likewise the transceiver 316 may also represent a separate transmitter and receivers.

A subject 318 is reposed on a subject support 320 within the bore 306 of the magnet 304. The subject 318 is partially within the imaging zone 308. Within the imaging zone 308 a field probe 322 is visible. The field probe 322 may also represent multiple field probes. For instance multiple field probes 322 could be positioned at various locations within the bore 306 of the magnet 304. This can enable the spatial temporal measurement of changes in the magnetic field. The field probe or probes 322 could be mounted in the radio-frequency coil 314, they could be lying freely on the subject 318, or they may be mounted within the bore 306 of the magnet.

The magnetic field gradient coil power supply 312 and the transceiver 316 are connected to a hardware interface 328 of computer system 326. The computer system 326 further comprises a processor 330. The processor 330 is connected to the hardware interface 328, a user interface 334, computer storage 336, and computer memory 338.

The computer storage is shown as containing a fluorine magnetic resonance data 340 and image magnetic resonance data 342. The magnetic resonance data 340, 342 has been acquired by the magnetic resonance imaging system 300. The computer storage 336 is further shown as containing a magnetic field map 344 which has been reconstructed from the fluorine magnetic resonance data 340. The computer storage 336 is further shown as containing corrected magnetic resonance data 345 which has been calculated using the magnetic field map 344 and the image magnetic resonance data 342. The computer storage 336 is further shown as containing an image 346 which has been reconstructed from the corrected magnetic resonance data 345. The computer storage 336 is further shown as containing a pulse sequence 348. A pulse sequence as used herein is a set of instructions which enables a magnetic resonance imaging system 300 to acquire magnetic resonance data 340, 342.

The computer memory 338 is shown as containing a control module 350. The control module 350 contains machine executable instructions which enable the processor to control the operation and function of the magnetic resonance imaging system 300. For instance the control module 350 may use the pulse sequence 348 to generate commands which enable the processor 330 to acquire the magnetic resonance data 340, 342. The computer memory 338 is further shown as containing a magnetic field calculation module 352. The magnetic field calculation module 352 comprises machine executable instructions which enable the processor 330 to calculate the magnetic field map 344 from the fluorine magnetic resonance data 340. The computer memory 338 is further shown as containing a data correction module 354. The data correction module 354 contains computer executable code which enables the processor 330 to calculate the corrected magnetic resonance data 345 from the magnetic field map 344 and the image magnetic resonance data 342. The computer memory 338 further contains an image reconstruction module 356. The image reconstruction module 356 contains computer executable code which enables the processor 330 to reconstruct the image 346 from the corrected magnetic resonance data 345.

Figure 4:
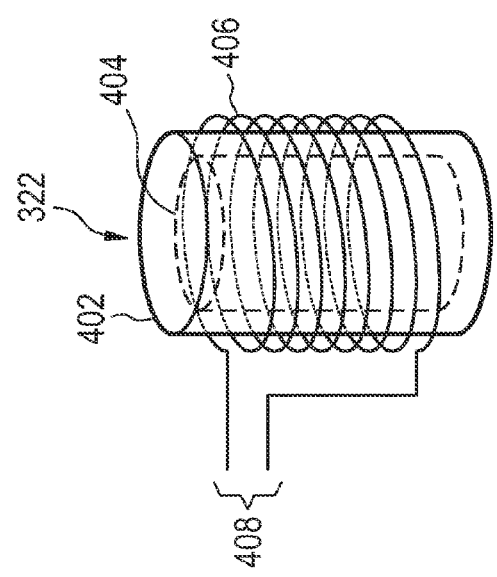
FIG. 4 illustrates a field probe according to an embodiment of the invention.

FIG. 4 shows an example of a field probe according to an embodiment of the invention. There is a container 402 filled with a fluorine sample 404. The container 402 would for instance be useful for storing a liquid. There is then a coil 406 or an antenna wrapped around the container 402. The coil 406 is configured for exciting and/or receiving NMR signals from the fluorine sample 404. The coil 406 further has a connection 408 for connecting to a receiver and/or transmitter. In some other embodiments such as when the fluorine sample 404 is a fluoroelastomer the container 402 and the fluorine sample 404 could be identical. For instance a cylinder or other shape that is solid could be fashioned from a fluoroelastomer which is then in the vicinity of a coil 406 or antenna.

Figure 5:
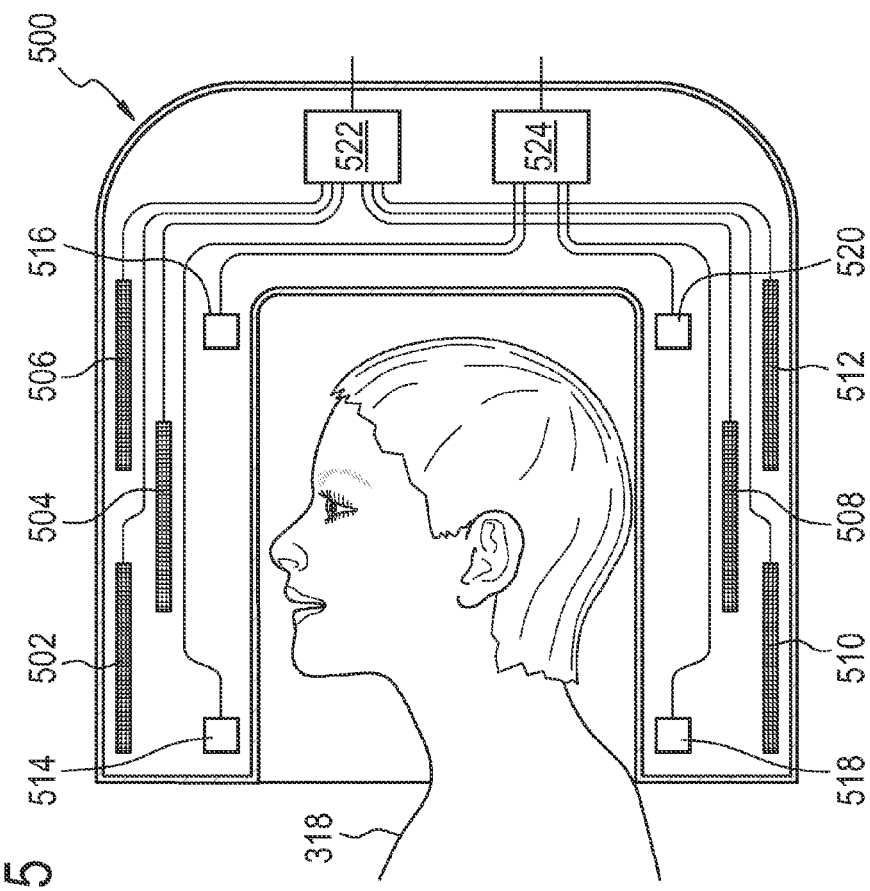
FIG. 5 shows a magnetic resonance coil sub-system according to an embodiment of the invention.

FIG. 5 shows a magnetic resonance coil sub-system 500 according to an embodiment of the invention. In this example the magnetic resonance coil sub-system 500 is an array of coils or antennas surrounding the head of a subject 318. The array of coils may be alternatively referred to as a surface coil or array coils. The magnetic resonance coil sub-system 500 contains a number of coil elements 502, 504, 506, 508, 510, and 512. The coil elements 502-512 typically include tune and/or de-tune electronics, matching electronics, and preamplifiers. Typically there are 4-32 coil elements in one coil or coil assembly. A magnetic resonance coil sub-system is typically connectable or detachable from the main magnetic resonance imaging system. One attaches the coil that is most suitable for the particular anatomy at hand such as the head, ankle, knee, or spine. In this example the head is being examined. Typically this is designed to closely fit the anatomy. The example shown in FIG. 5 represents the example of a head-coil. Also within the magnetic resonance coil sub-system 500 are field probes 514, 516, 518, and 520. The field probes are according to an embodiment of the invention. Depending upon the type of field map which is desired there may be a larger or smaller number of field probes 514-520 within a magnetic resonance coil sub-system. If a larger degree of spatial information is desired about the magnetic field a larger number of field probes 512-520 may be incorporated into the coil sub-system 500. In this embodiment a coil element interface 522 is shown. The coil element interface 522 is configured for interfacing the coil elements 502-512 to the magnetic resonance imaging system. The interface electronics may in some embodiments perform signal digitalization and the interface may also be in some embodiments integrated within the coil elements. The coil sub-system 500 further comprises field probe interface 524. The field probe interface 524 may for instance contain further amplification, digitization and data compression. It may also provide radio-frequency-transmit electronics and possibly transmit and/or receive switches. In alternative embodiments the coil elements 502-512 and/or the field probes 514-520 are connected directly to a receiver and/or transmitter.

An advantage of siloxanes over carbon chains, is that the former tend to be much softer, which favourably affects the ratio $T_1/T_2$ of the fluorine nuclei. Such a substance, known under the name FVMQ is commercially available, e.g. as "silastic". The fluorine $T_1$ and $T_2$ of this polymeric compound (527 ms and 5 ms, respectively, at 7 Tesla) are significantly more suitable for the use in field probes as compared to more commonly known perfluorocarbon-based polymers like Teflon (2600 ms and 0.4 ms, respectively, at 7 Tesla).

Another approach is to use a solution of a fluorine-containing compound. The solvent may be water or an organic solvent. Such materials are usually stable, not volatile and can be easily stored (except for HF) in glass or plastic vials. The big advantage of "aqueous field probes" is that the fluorine $T_1$ and $T_2$ can be adjusted to the optimal values by adding soluble paramagnetic compounds to the solution. Below we list, for the purpose of example and is not exhaustive of all possibilities, a number of exemplary water-soluble organic and anorganic compounds that may be used for this purpose:

1. Fluoride (F) containing acids and salts, e.g. LiF, NaF, KF, $NH_4F$, $MgF_2$, $CuF_2$, $MnF_2$, etc. Most notably, RbF (Rubidium fluoride) or ammonium bifluoride ($NH_4HF_2$) could be used since this has a very high molar solubility in water. The use of paramagnetic cations has the advantage that no additional relaxation agents may be needed to adjust T1 and T2.

2. $SiF_6^-$-containing acids and salts, e.g. $LiSiF_6$, $NaSiF_6$, $KSiF_6$, $NH_4SiF_6$, $Mg(SiF_6)_2$, $Cu(SiF_6)_2$, $Mn(SiF_6)_2$, etc. These salts tend to be easily soluble. However, 4.7% of the natural Si abundance has a nuclear spin ($^{29}Si$, $S=\frac{1}{2}$). The large scalar coupling of this nucleus with the $^{19}F$ nucleus ($^1J_{SiF}$) may be disadvantageous for the use in field probes. The use of paramagnetic cations has the advantage that no additional relaxation agents may be needed to adjust T1 and T2.

3. $PF_6^-$-containing acids and salts, e.g. $LiPF_6$, $NaPF_6$, $KPF_6$, $NH_4PF_6$, $Mg(PF_6)_2$, $Cu(PF_6)_2$, $Mn(PF_6)_2$, etc. These salts tend to be easily soluble. However, 100% of the natural abundance of the phosphorus nucleus has a nuclear spin ($^{31}P$, $S=\frac{1}{2}$). The large scalar coupling of this nucleus with the $^{19}F$ nucleus ($^1J_{PF}$) may be disadvantageous for the use in field probes. The use of paramagnetic cations may have the advantage that no additional relaxation agents may be needed to adjust T1 and T2.

4. $BF_4^-$-containing acids and salts, e.g. $LiBF_4$, $NaBF_4$, $KBF_4$, $NH_4BF_4$, $Mg(BF_4)_2$, $Cu(BF_4)_2$, $Mn(BF_4)_2$, etc. These salts tend to be easily soluble. $BF_4^-$-containing salts may be particularly useful because of the quadrupolar nature of the boron isotopes. Although 100% of the natural abundance of the boron nucleus has a nuclear spin ($^{10}B$, $S=3$ or $^{11}B$, $S=\frac{3}{2}$), the $^{19}F$-MR signal splitting as a result of $^1J_{BF}$ scalar coupling is very small as a result of the quadrupolar interaction. The use of paramagnetic cations may have the advantage that no additional relaxation agents may be needed to adjust T1 and T2.

5. Triflate (Trifluoromethanesulfonate, $CF_3SO_3^-$, OTf$^-$)-containing acids and salts, e.g. Li OTf, Na OTf, K OTf, $NH_4$ OTf, Mg $(OTf)_2$, Mn $(OTf)_2$, etc. The use of paramagnetic cations may have the advantage that no additional relaxation agents may be needed to adjust T1 and T2.

6. Trifluoroacetate ($CF_3CO_2^-$)-containing acids and salts, e.g. Li $CF_3CO_2$, Na $CF_3CO_2$, K $CF_3CO_2$, $NH_4$ $CF_3CO_2$, Mg $(CF_3CO_2)_2$, Cu $(CF_3CO_2)_2$, Mn $(CF_3CO_2)_2$, etc. The use of paramagnetic cations may have the advantage that no additional relaxation agents may be needed to adjust T1 and T2.

Examples of water-soluble agents for $^{19}F$-MR relaxation enhancement that can be added to the aforementioned aqueous field probes in order to adjust the relaxation times to the optimal values are listed below:

1. $Gd^{3+}$-containing salts like $GdCl_3$
2. Salts containing any of the lanthanide ions
3. $Gd^{3+}$-containing chelates, like GdDTPA, GdDOTA, GdHPDO3A, etc.
4. $Cu^{2+}$-containing salts like $Cu(NO_3)_2$ and $CuSO_4$
5. $Mn^{2+}$-containing salts like $MnSO_4$
6. Any other water-soluble paramagnetic compound Table 1 illustrates experimental results in adjusting the fluorine T1 and T2 relaxation times of aqueous tetrafluoroborate ($BF_4^-$) with the use of copper(II).

TABLE 1

Fluorine T1 and T2 NMR relaxation times of aqueous tetrafluoroborate ($BF_4^-$) at various concentrations of paramagnetic copper(II) or gadolinium(III).

| Fluorine containing compound | Fluorine concentration (M)$^a$ | Paramagnetic solute | Concentration of solute (g/L) | $T_1$ (ms)$^b$ | $T_2$ (ms)$^c$ |
| --- | --- | --- | --- | --- | --- |
| Sodium tetrafluoroborate | 18 | — | — | 2636 | 662 |
| Sodium tetrafluoroborate | 18 | Copper(II) nitrate trihydrate | 6 | 251 | 131 |

TABLE 1-continued

Fluorine T1 and T2 NMR relaxation times of aqueous tetrafluoroborate ($BF_4^-$) at various concentrations of paramagnetic copper(II) or gadolinium(III).

| Fluorine containing compound | Fluorine concentration (M)$^a$ | Paramagnetic solute | Concentration of solute (g/L) | $T_1$ (ms)$^b$ | $T_2$ (ms)$^c$ |
|---|---|---|---|---|---|
| Sodium tetrafluoroborate | 12 | Copper(II) nitrate trihydrate | 330 | 3.9 | 2.4 |
| Copper tetrafluoroborate hydrate | 54 | — | — | 0.6 | 0.3 |
| Sodium tetrafluoroborate | 20 | Gadolinium(III) chloride | 5$^d$ | 547 | 340 |
| Sodium tetrafluoroborate | 19 | Gadolinium(III) DTPA | 4$^d$ | 599 | 318 |

In table 1:
$^a$Fluorine concentrations were calculated from the amounts of dissolved tetrafluoroborate and the estimated final volume.
$^b$Fluorine T1 values were measured at a magnetic-field strength of 7 Tesla with the use of a standard inversion-recovery MR (Magnetic Resonance) pulse sequence.
$^c$Fluorine T2 values were measured at a magnetic-field strength of 7 Tesla with the use of a standard CPMG (Carr-Purcell-Meiboom-Gill) MR pulse sequence.
$^d$The actual concentration of the paramagnetic solute is probably lower since precipitation occurred when adding the aqueous solution of the paramagnetic species to the tetrafluorborate solution.

In principle, paramagnetic metal ions with the highest effective magnetic moments and favorable electronic relaxation times (such as $Mn^{2+}$ and $Gd^{3+}$) would be preferred for this purpose as these are expected to have the highest effect on the fluorine T1 and T2. Unfortunately, many of the paramagnetic fluorides have a rather low solubility product. Since $BF_4^-$, $PF_6^-$, and $SiF_6^-$ may generate free fluoride ions in the case of hydrolysis, the maximal reduction in T1 and T2 that can be achieved in practice may be rather limited for many of the paramagnetic metal ions. $CuF_2$, however, has a relatively high solubility product and $Cu^{2+}$ ions, therefore, are expected to be very useful for this approach. A concentrated aqueous solution of $Cu(BF_4)_2$ showed relaxation times (T1=0.6 ms, T2=0.3 ms) that correspond to the desired values.

A third approach is the use of a fluorine-containing, room-temperature ionic liquid, such as an ionic liquid in which the anion is tetrafluoroborate, hexafluorophosphate, tetrafluoroaluminate, hexafluoroantimonate, hexafluoroarsenate, bis(trifluoromethane)sulfonimide, tris(trifluoromethylsulfonyl)methide, or triflate. The latter three anions may be preferred, since these are less hydrolysis-sensitive and less toxic. Ionic liquids have a unique combination of favourable properties for the application in field probes:

1. Since it is a liquid at room temperature, the $T_2$ is intrinsically longer as compared to a solid.
2. Since it is a pure liquid substance, the concentration, and therefore also the $^{19}F$ MR signal, is inherently high.
3. Paramagnetic ions can be easily dissolved in the pure ionic liquid and the $^{19}F$-MR $T_1$ relaxation time can be adjusted to a practical value (see results in the table 2 below).
4. No water is present, so there is no risk of hydrolysis of the fluorine-containing anions, provided that the container is properly sealed
5. The substance is not slippery, not volatile (ionic liquids are known to have a very low vapour pressure), and not sensitive to degradation by oxidation or reduction (ionic liquids are known to have a high conductivity).

Figure 6:
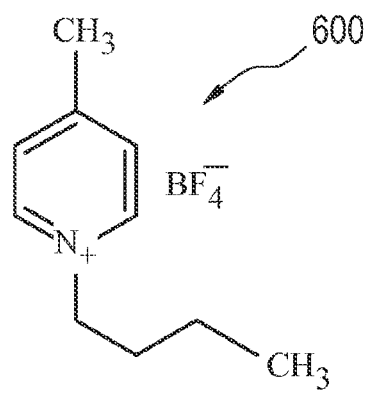
FIG. 6 shows an example of a fluorine-containing room-temperature ionic liquid.

FIG. 6 shows an example (1-Butyl-4-methylpyridinium tetrafluoroborate) of a fluorine-containing room-temperature ionic liquid 600.

Figure 7:
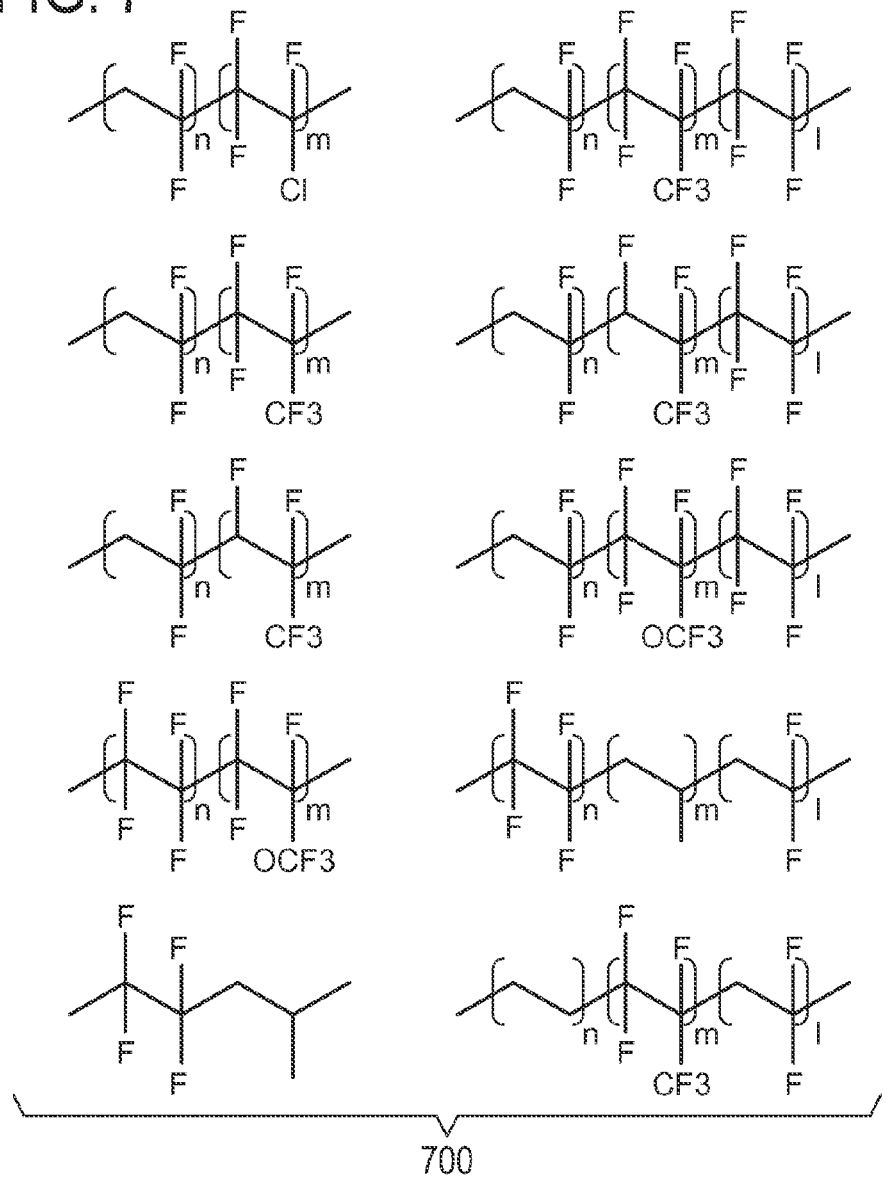
FIG. 7. shows examples of fluorocarbon elastomers.

FIG. 7 shows examples of fluorocarbon elastomers 700. The number of monomeric repeats are indicated with l, m, and n.

Figure 8:
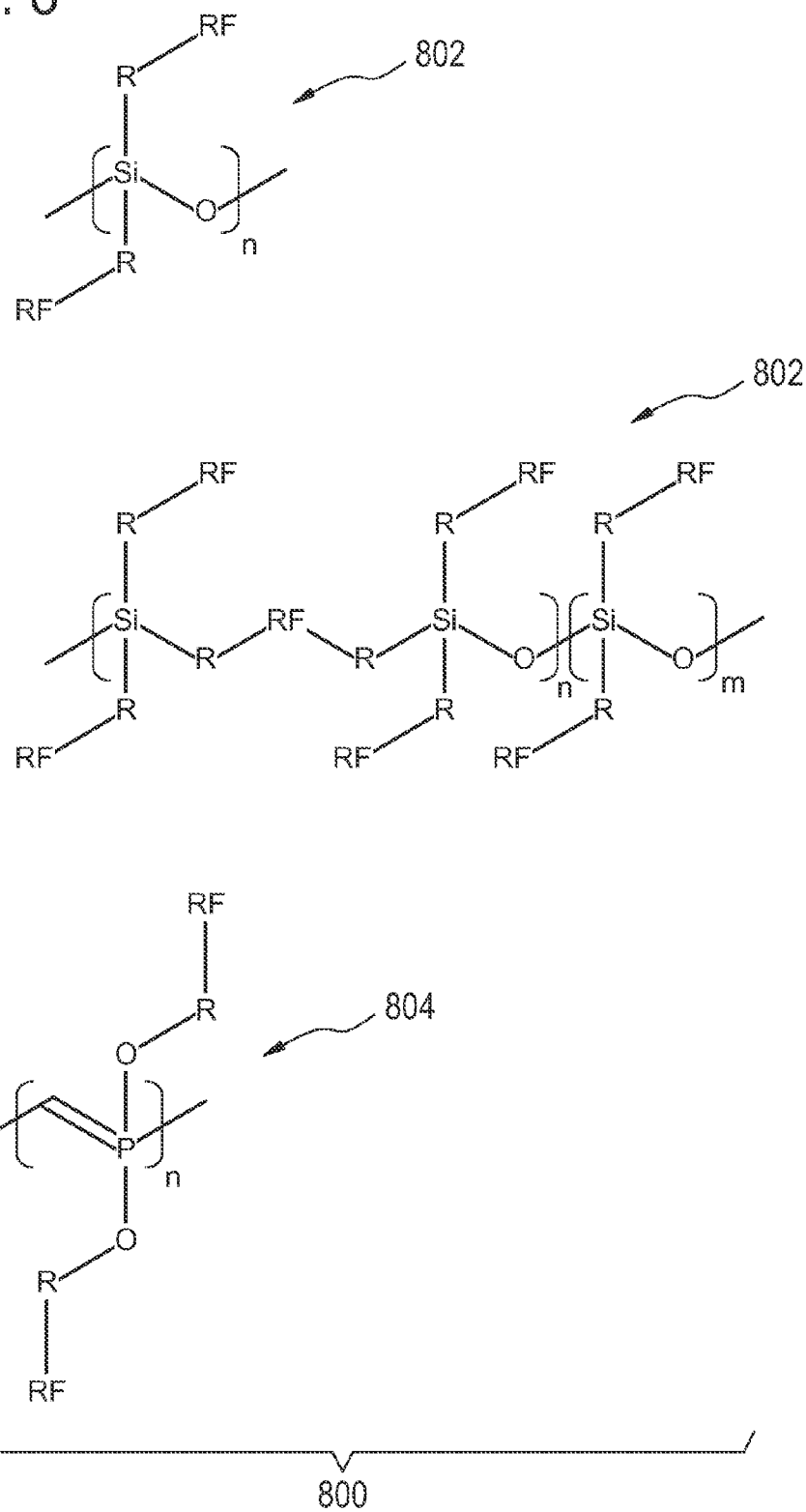
FIG. 8 shows several examples of fluoro inorganic polymers.

FIG. 8 shows several examples of fluoro inorganic polymers 800. The polymers labeled 802 are fluorosilicones. The polymer labeled 804 is a fluorophosphazene. The number of monometric repeats are indicated with l, m, and n. R represents an alkyl chain and RF represents a fluorinated alkyl group.

Fluorine-containing polymers may also be used as the main source of fluorine nuclei needed for the $^{19}F$-NMR signal for MR field probes. Fluoroelastomers constitute a special class of fluorine-containing polymers that are amorphous and exist above their glass transition temperature so that considerable segmental motion is possible. As a consequence, these polymers show relatively high viscoelasticity, notably low Young's moduli, and high yield strain as compared to other fluorine-containing polymers. Hence, fluoroelastomers are expected to have more favourable (i.e. smaller) $T_1/T_2$ ratios as compared to other fluorine-containing polymers. Typical examples are fluorocarbon elastomers like vinylidenefluoride-, tetrafluoroethylene-, perfluoromethylvinylether, chlorotrifluoroethylene-, pentafluoropropylene, and hexafluoropropylene-based elastomers (cf. FIG. 7) and fluoroinorganic polymers like fluorosilicones and fluorophosphazenes (cf. FIG. 8).

Table 2 illustrates experimental results in adjusting the T1 and T2 relaxation times for several fluorine-containing, room-temperature ionic liquids. The T1 and T2 relaxations times of 1-Ethyl-3-methylimidazolium bis(trifluoromethylsulfonyl)imide and 1-Butyl-4-methylpyridinium tetrafluoroborate were measured both before and after 20 mg/g of $Mn(Tf)_3$ was added.

TABLE 2

Fluorine T1 and T2 NMR relaxation times of two room-temperature ionic liquids at various concentrations of paramagnetic manganese(II) and gadolinium(III).

| Fluorine containing compound | Fluorine concentration (M)[a] | Paramagnetic solute | Concentration of solute (g/L) | $T_1$ (ms)[b] | $T_2$ (ms)[c] |
|---|---|---|---|---|---|
| 1-Ethyl-3-methylimidazolium bis(trifluoromethylsulfonyl)imide | 23.4 | — | — | 881 | 632 |
| 1-Ethyl-3-methylimidazolium bis(trifluoromethylsulfonyl)imide | 23.4 | $Mn(Tf)_3$ | 23 | 6.1 | 0.9 |
| 1-Ethyl-3-methylimidazolium bis(trifluoromethylsulfonyl)imide | 23.4 | $Gd(Tf)_3$ | 15[d] | 61 | 8.2 |
| 1-Butyl-4-methylpyridinium tetrafluoroborate | 20.2 | — | — | 816 | 260 |
| 1-Butyl-4-methylpyridinium tetrafluoroborate | 20.2 | $Mn(Tf)_3$ | 20 | 0.9 | 0.4 |
| 1-Butyl-4-methylpyridinium tetrafluoroborate | 20.2 | $Gd(Tf)_3$ | 21[d] | 389 | 12 |

In table 2:
[a] Fluorine concentrations were calculated from the densities of the ionic liquids.
[b] Fluorine T1 values were measured at a magnetic-field strength of 7 Tesla with the use of a standard inversion-recovery MR pulse sequence.
[c] Fluorine T2 values were measured at a magnetic-field strength of 7 Tesla with the use of a standard CPMG MR pulse sequence.
[d] The actual concentration of the paramagnetic solute is probably lower since the final mixture appeared opaque even after stirring vigorously and after several heating-cooling cycli.

The data in this table illustrate how both the T1 and T2 relaxation time of a room temperature ionic liquid containing Fluorine can be reduced. The reduction of the T1 relaxation time is particularly beneficial, because it enables sequential magnetic field measurement to be performed more rapidly. A limitation on how often the magnetic field measurements can be made is the T2 relaxation time. The T2 value in both cases may be increased to at least 100 ms by using a smaller concentration of the $Mn(Tf)_3$.

While the invention has been illustrated and described in detail in the drawings and foregoing description, such illustration and description are to be considered illustrative or exemplary and not restrictive; the invention is not limited to the disclosed embodiments.

Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. A single processor or other unit may fulfill the functions of several items recited in the claims. The mere fact that certain measures are recited in mutually different dependent claims does not indicate that a combination of these measured cannot be used to advantage. A computer program may be stored/distributed on a suitable medium, such as an optical storage medium or a solid-state medium supplied together with or as part of other hardware, but may also be distributed in other forms, such as via the Internet or other wired or wireless telecommunication systems. Any reference signs in the claims should not be construed as limiting the scope.

LIST OF REFERENCE NUMERALS 300 magnetic resonance imaging system
304 magnet
306 bore of magnet
308 imaging zone
310 magnetic field gradient coils
312 magnetic field gradient coil power supply
314 radio-frequency coil
316 transceiver
318 subject
320 subject support
322 field probe
326 computer system
328 hardware interface
330 processor
332 user interface
334 user interface
336 computer storage
338 computer memory
340 fluorine magnetic resonance data
342 image magnetic resonance data
344 magnetic field map
345 corrected magnetic resonance data
346 image
348 pulse sequence
350 control module
352 magnetic field calculation module
354 data correction module
356 image reconstruction module
402 container
404 fluorine sample
406 coil or antenna
408 connection for receiver
500 magnetic resonance coil subsystem
502 coil element
504 coil element
506 coil element
508 coil element
510 coil element
512 coil element
514 field probe
516 field probe
518 field probe
520 field probe
522 coil element interface
524 field probe interface
600 ionic liquid
700 fluorocarbon elastomers
800 fluoroinorganic polymers
802 fluorosilicone
804 polyfluorophosphazenes

The invention claimed is:

1. A method of measuring a magnetic field within a magnetic resonance imaging system,
the magnetic resonance imaging system including a magnet for providing an imaging zone, a radio-frequency transceiver, and a magnetic field probe, wherein the magnetic field probe is located within the imaging zone, wherein the magnetic field probe comprises a fluorine sample including an $^{19}$F active nucleus, the fluorine sample includes an $^{19}$F containing ionic liquid including a fluorine relaxation agent, wherein the fluorine sample contains ionic liquid is 1-Ethyl-3-methylimidazolium bis(trifluoromethylsulfonyl)imide or 1-Butyl-4-methylpyridinium tetrafluoroborate, and wherein the fluorine relaxation agent is manganese trifluoromethanesulfonate or gadolinium trifluoromethanesulfonate, wherein the magnetic field probe further comprises an antenna for manipulating the magnetic spins of the fluorine sample and for receiving fluorine magnetic resonance data from the fluorine sample, and wherein the antenna is connected to the radio-frequency transceiver, wherein the method comprises the steps of:
acquiring the fluorine magnetic resonance data using the magnetic resonance imaging system; and
calculating a magnetic field strength using the fluorine magnetic resonance data.

2. The method of claim 1, wherein the $^{19}$F active nucleus is in any one of the following: bis(trifluoromethylsulfonyl)imide, tetrafluoroborate, hexafluorophosphate, tetrafluoroaluminate, hexafluoroantimonate, hexafluoroarsenate, bis(trifluoromethane)sulfonimide, and tris(trifluoromethylsulfonyl)methide.

3. The method of claim 2, wherein the method further comprise the steps of:
acquiring image magnetic resonance data from a subject in the imaging zone using the magnetic resonance imaging system;
calculating corrected magnetic resonance data using the magnetic field strength and the image magnetic resonance data; and
reconstructing an image of the subject from the corrected magnetic resonance data.

4. A method of measuring a magnetic field within a magnetic resonance imaging system,
the magnetic resonance imaging system comprising a magnet for providing an imaging zone, a radio-frequency transceiver, and a magnetic field probe located within the imaging zone, wherein the magnetic field probe comprises an active nucleus, wherein the active nucleus includes fluorine 19 ($^{19}$F) in a fluoroelastomer, wherein the magnetic field probe further comprises an antenna for manipulating the magnetic spins of the active nucleus in the fluoroelastomer and for receiving fluorine magnetic resonance data from the fluoroelastomer, and wherein the antenna is connected to the radio-frequency transceiver,
wherein the method comprises the steps of:
acquiring the fluorine magnetic resonance data using the magnetic resonance imaging system; and
calculating magnetic field strength in the imaging zone using the fluorine magnetic resonance data.

5. The method of claim 4, wherein the active nucleus that includes $^{19}$F is in any one of the following fluoroelastomers: a siloxane, a fluorinated polysiloxane (FVMQ), a fluorine containing polymer, methyl vinyl silicone, fluorine-containing polymers, a vinylidenefluoride elastomer, a tetrafluoroethylene elastomer, a perfluoromethylvinylether, a chlorotrifluoroethylene based elastomer, pentafluoropropylene, a hexafluoropropylene elastomer, a fluoroinorganic polymers, a fluorosilicone, and a fluorophosphazene.

6. The method of claim 4, wherein the method further comprise the steps of:
acquiring image magnetic resonance data from a subject in the imaging zone using the magnetic resonance imaging system;
calculating corrected magnetic resonance data using the magnetic field strength and the image magnetic resonance data; and
reconstructing an image of the subject from the corrected magnetic resonance data.

7. A magnetic field probe for a magnetic resonance imaging system comprising:
a fluorine containing ionic liquid sample including a $^{19}$F active nucleus containing ionic liquid, and a fluorine relaxation agent, wherein the fluorine relaxation agent is manganese trifluoromethanesulfonate; and
an antenna configured to manipulate magnetic spins of the fluorine containing ionic liquid sample and for receiving fluorine magnetic resonance data from the $^{19}$F active nucleus.

8. A magnetic resonance imaging system comprising:
a magnet configured to provide a magnetic field in an imaging zone;
the magnetic field probe according to claim 7 located within the imaging zone;
a radio frequency transceiver configured to excite resonance in the $^{19}$F active nucleus and receive resonance signals from the $^{19}$F active nucleus; and
at least one computer processor configured to:
calculate change in a strength of the magnetic field in the imaging zone from the resonance signals from the $^{19}$F active nucleus from the radio frequency transceiver and
reconstruct an image of a subject in the imaging zone corrected for the calculated changes in the strength of the magnetic field.

9. The magnetic field probe of claim 7, wherein the fluorine containing ionic liquid is 1-Ethyl-3-methylimidazolium bis(trifluoromethylsulfonyl)imide or 1-Butyl-4-methylpyridinium tetrafluoroborate.

10. A method of measuring a magnetic field within a magnetic resonance imaging system,
the magnetic resonance imaging system including a magnet configured to provide an imaging zone, a radio-frequency transceiver, and a magnetic field probe located within the imaging zone, wherein the magnetic field probe contains a $^{19}$F active ion including a $^{19}$F active nucleus in an aqueous solution of a paramagnetic cat-ion salt, wherein the field probe further comprises an antenna for manipulating the magnetic spins of the $^{19}$F active nucleus and for receiving fluorine magnetic resonance data from the $^{19}$F active nucleus, and wherein the antenna is connected to the radio-frequency transceiver,
wherein the method comprises the steps of:
acquiring the fluorine magnetic resonance data using the magnetic resonance imaging system; and
calculating a magnetic field strength using the fluorine magnetic resonance data.

11. The method of claim 10, wherein the method further comprise the steps of:
acquiring image magnetic resonance data from a subject in the imaging zone using the magnetic resonance imaging system;
calculating corrected magnetic resonance data using the magnetic field strength and the image magnetic resonance data; and
reconstructing an image of the subject from the corrected magnetic resonance data.

12. The method of claim 10, wherein the $^{19}$F active ion comprises an anion, wherein the anion is any one of the following: bis(trifluoromethylsulfonyl)imide, tetrafluoroborate, hexafluorophosphate, tetrafluoroaluminate, hexafluoroantimonate, hexafluoroarsenate, bis(trifluoromethane)sulfonimide, and tris(trifluoromethylsulfonyl)methide.

13. The method of claim 12, further including a fluorine relaxation agent in the aqueous solution.

14. The method of claim 10, wherein the $^{19}$F active ion in the aqueous solution includes any one of the following: a trifluoroacetate salt, hydrofluoric acid, a flouride salt, a hexafluorosilicic salt, a hexafluorophosphate salt, with copper (II), manganese (I) or a trivalent ion of a lanthanide series as a counter ion.

15. A magnetic resonance imaging system, comprising:
a magnet configured to provide a magnetic field;
an imaging zone;
a magnetic field probe located within the imaging zone, the magnetic field probe containing a $^{19}$F active ion in an aqueous solution of a paramagnetic cat-ion salt, the $^{19}$F active ion including an $^{19}$F active nucleus and including an antenna for manipulating the magnetic spins of the $^{19}$F active nucleus and for receiving fluorine magnetic resonance from the $^{19}$F active nucleus;
a radio frequency transceiver configured to supply transmitting magnetic resonance excitation and manipulation radiofrequency signals to the antenna and receive $^{19}$F magnetic resonance data from the antenna; and
one or more processors configured to:
receive the $^{19}$F magnetic resonance data from the radio frequency transceiver; and
calculate a magnetic field strength in the imaging zone using the $^{19}$F magnetic resonance data.

16. The magnetic resonance imaging system of claim 15, wherein the one or more processors are further configured to:
receive image magnetic resonance data from a subject in the imaging zone via the radio frequency transceiver;
calculate corrected magnetic resonance data using the magnetic field strength and the image magnetic resonance data; and
reconstruct an image of the subject from the corrected magnetic resonance data.

17. A magnetic field probe for a magnetic resonance imaging system comprising:
an imaging zone;
a magnetic field probe located within the imaging zone, the magnetic field probe containing a $^{19}$F active anion in an aqueous solution of a paramagnetic cat-ion salt, the $^{19}$F active anion including an $^{19}$F active nucleus and including an antenna for manipulating the magnetic spins of the $^{19}$F active nucleus and for receiving fluorine magnetic resonance from the $^{19}$F active nucleus;
a radio frequency transceiver configured to supply transmitting magnetic resonance excitation and manipulation radiofrequency signals to the antenna and receive $^{19}$F magnetic resonance data from the antenna; and
one or more processors configured to:
receive the $^{19}$F magnetic resonance data from the radio frequency transceiver; and
calculate a magnetic field strength in the imaging zone using the $^{19}$F magnetic resonance data;
a fluorine sample disposed in the magnetic field probe, and comprising a $^{19}$F active anion in an aqueous solution of a paramagnetic cat-ion salt; and
an antenna configured to manipulate magnetic spins of the fluorine sample and for receiving fluorine magnetic resonance data from the $^{19}$F active anion.

18. The magnetic field probe of claim 17, wherein the $^{19}$F active anion, wherein the $^{19}$F active anion is any one of the following: bis(trifluoromethylsulfonyl)imide, tetrafluoroborate, hexafluorophosphate, tetrafluoroaluminate, hexafluoroantimonate, hexafluoroarsenate, bis(trifluoromethane)sulfonimide, and tris(trifluoromethylsulfonyl)methide.

19. The magnetic field probe of claim 17, wherein the paramagnetic cat-ion salt comprises one of a fluoride ($F^-$)-containing salt, sulfur hexafluoride ($SiF_6^-$)-containing salt, a hexafluorphosphate ($PF_6^-$)-containing salt, a tetrafluoroborate ($BF_4^-$)-containing salt, a triflate (Trifluoromethanesulfonate, $CF_3SO_3^-$, $OTf^-$)-containing salt, and a Trifluoroacetate ($CF_3CO_2^-$)-containing salt.

* * * * *